(12) United States Patent
Lunsman et al.

(10) Patent No.: US 12,336,138 B2
(45) Date of Patent: Jun. 17, 2025

(54) VARIABLE FLOW LIQUID-COOLED COOLING MODULE

(71) Applicant: HEWLETT PACKARD ENTERPRISE DEVELOPMENT LP, Spring, TX (US)

(72) Inventors: Harvey J. Lunsman, Chippewa Falls, WI (US); Tahir Cader, Liberty Lake, WA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 361 days.

(21) Appl. No.: 17/935,224

(22) Filed: Sep. 26, 2022

(65) Prior Publication Data

US 2024/0107706 A1    Mar. 28, 2024

(51) Int. Cl.
H05K 7/20 (2006.01)

(52) U.S. Cl.
CPC ..... *H05K 7/20272* (2013.01); *H05K 7/20254* (2013.01); *H05K 7/20281* (2013.01); *H05K 7/20509* (2013.01)

(58) Field of Classification Search
CPC ........... H05K 7/20272; H05K 7/20254; H05K 7/20509; H05K 7/20281; H05K 1/0203;
(Continued)

(56) References Cited

U.S. PATENT DOCUMENTS

| 5,237,957 A | * | 8/1993 | Liucci | G01L 19/12 |
| | | | | 116/272 |
| 7,957,132 B2 | | 6/2011 | Fried | |

(Continued)

FOREIGN PATENT DOCUMENTS

| WO | 2018/183402 A1 | 10/2018 |
| WO | 2020/102090 A1 | 5/2020 |
| WO | 2020/256638 A1 | 12/2020 |

OTHER PUBLICATIONS

A side put type integrated temperature control valve with side flow pipe of heat exchanger, Chen, CN202251796 (Year: 2012).*

(Continued)

*Primary Examiner* — Michael A Matey
(74) *Attorney, Agent, or Firm* — Hewlett Packard Enterprise Patent Department

(57) ABSTRACT

Example implementations relate to a cooling module, and a method of cooling an electronic circuit module. The cooling module includes first and second cooling components fluidically connected to each other. The first cooling component includes a first fluid channel having supply, return, and body sections, and a second fluid channel. The second cooling component includes an intermediate fluid channel. The body section is bifurcated into first and second body sections, and the first and second body sections are further merged into a third body section. The supply section is connected to the first and second body sections. The return section is connected to the third body section and the intermediate fluid channel via an inlet fluid-flow path established between the first and second cooling components. The second fluid channel is connected to the intermediate fluid channel via an outlet fluid-flow path established between the first and second cooling components.

20 Claims, 11 Drawing Sheets

(58) Field of Classification Search
CPC . H05K 7/20218; G06F 1/20; G06F 2200/201; H01L 23/473; B60H 1/038; B60H 1/00485; B60Y 2306/05; F01P 2007/146; F01P 7/14; F16K 15/063; F16K 17/40; F16L 29/02; F16L 37/32; F28F 13/08; F28F 27/02; F28F 3/12
See application file for complete search history.

(56) References Cited

U.S. PATENT DOCUMENTS

| | | | |
|---|---|---|---|
| 8,422,218 | B2 | 4/2013 | Fried et al. |
| 8,613,297 | B2* | 12/2013 | Adams .............. H01M 8/04201 |
| | | | 141/354 |
| 10,225,957 | B2 | 3/2019 | Gao et al. |
| 10,980,154 | B1 | 4/2021 | Gao |
| 2009/0229812 | A1* | 9/2009 | Pineo ..................... F28F 27/02 |
| | | | 137/468 |
| 2009/0250021 | A1* | 10/2009 | Zarrabi .............. F02M 51/0614 |
| | | | 123/90.11 |
| 2011/0240281 | A1 | 10/2011 | Avery |
| 2012/0132413 | A1* | 5/2012 | Cheadle .................. F28F 27/02 |
| | | | 165/297 |
| 2014/0103234 | A1* | 4/2014 | Barreda ................ F16K 15/063 |
| | | | 251/66 |
| 2015/0160702 | A1 | 6/2015 | Franz |
| 2017/0241682 | A1* | 8/2017 | Su ......................... F28D 7/0066 |
| 2018/0131128 | A1* | 5/2018 | Franz ................. H01R 13/5219 |
| 2020/0173742 | A1* | 6/2020 | Butcka ................ F16K 11/0716 |
| 2020/0263596 | A1* | 8/2020 | Lee ....................... G05D 23/022 |
| 2020/0344918 | A1 | 10/2020 | Wondimu et al. |
| 2023/0349460 | A1* | 11/2023 | Mason ................ F16H 57/0435 |

OTHER PUBLICATIONS

Thermoelectric generation system integrated exhaust heat recovery device, Han et al. KR 20180054184 (Year: 2018).*

* cited by examiner

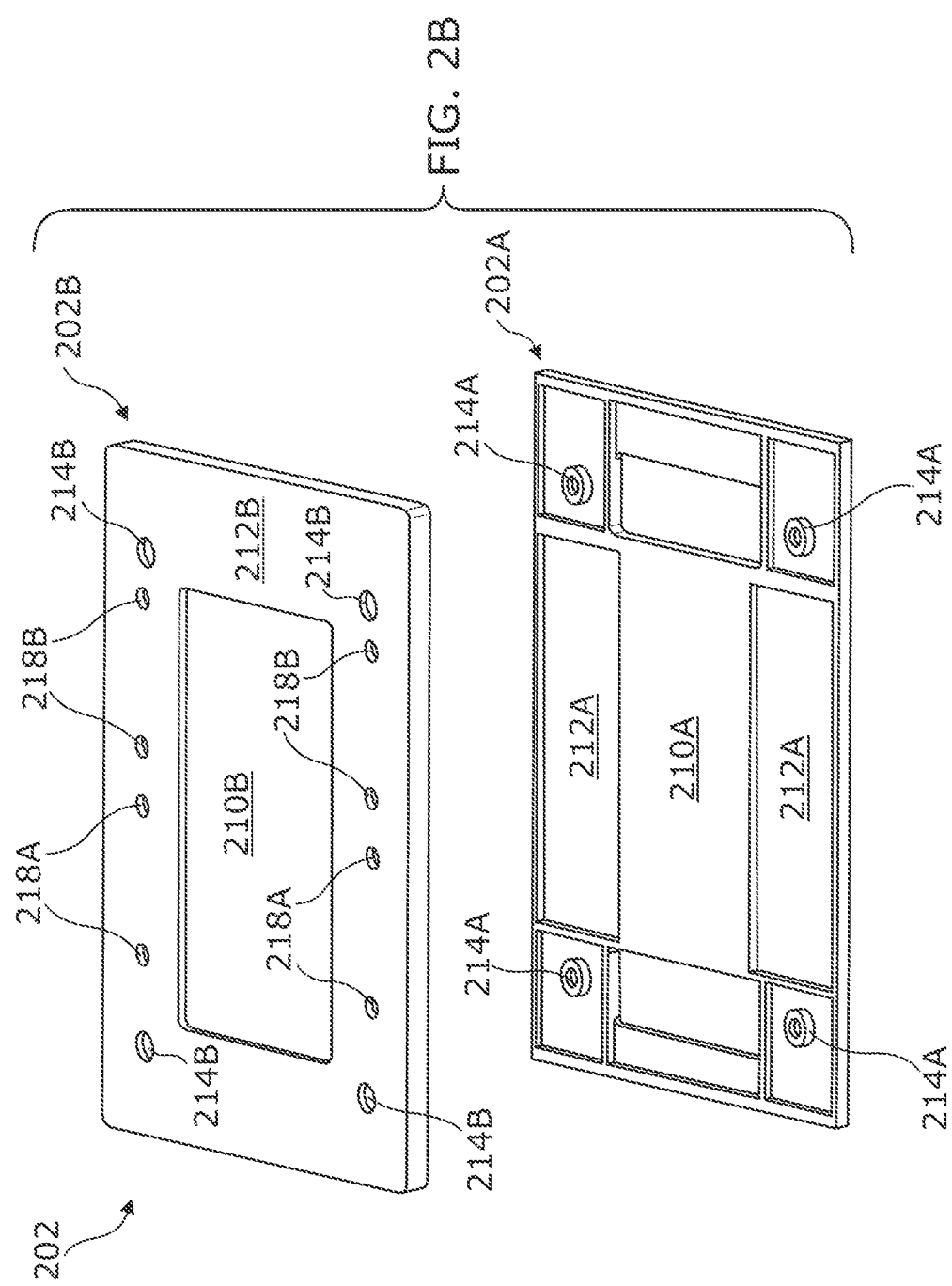

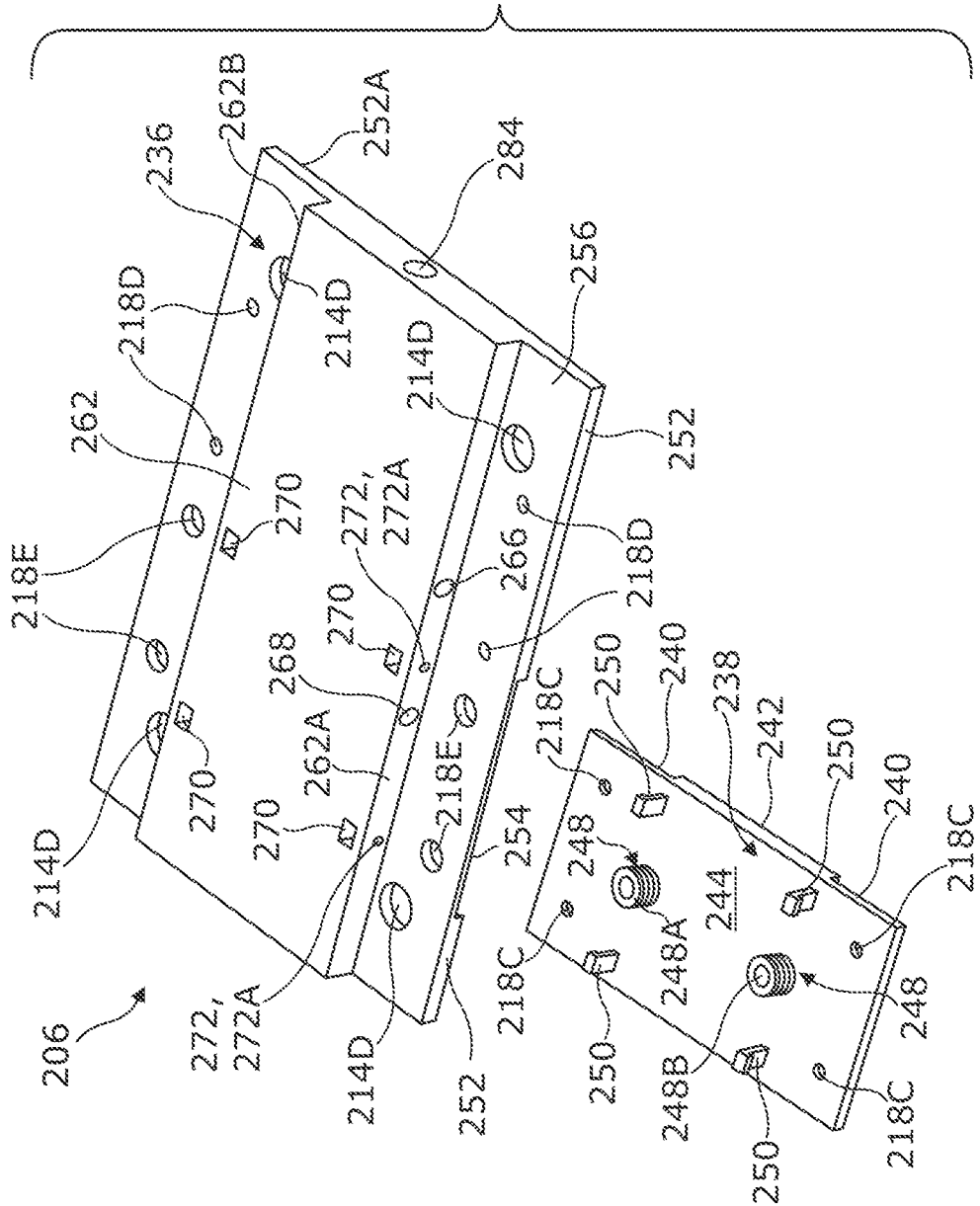

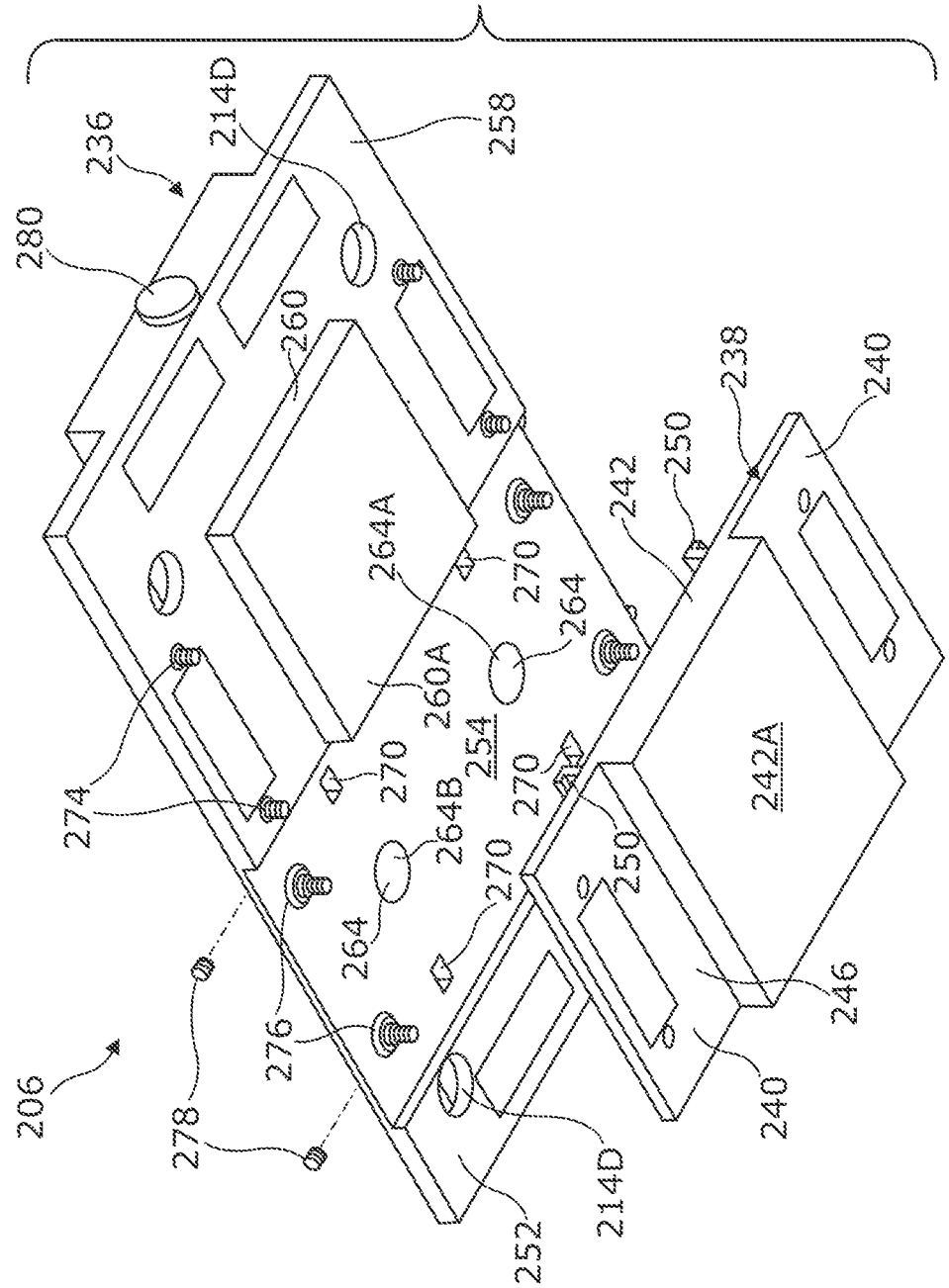

VARIABLE FLOW LIQUID-COOLED COOLING MODULE

BACKGROUND

An electronic device, such as a computer, a networking device, etc., may include a circuit module, such as a multichip module having a substrate with one or more chips (e.g., central processing units (CPUs), graphics processing units (GPUs), power supply chips, memory chips, etc.) mounted on the substrate. The chips and/or the substrate may generate waste heat during their operation. In order to minimize adverse effects of such waste heat on the circuit module, the electronic device may include a thermal management system to draw the waste heat away from the chips of the circuit module.

BRIEF DESCRIPTION OF THE DRAWINGS

Various examples will be described below with reference to the following figures.

FIG. 2B illustrates an exploded perspective view of the frame of FIG. 2A according to an example implementation of the present disclosure

FIG. 2D illustrates an exploded perspective top view of a cooling module of FIG. 2A according to an example implementation of the present disclosure.

FIG. 2E illustrates an exploded perspective bottom view of a cooling module of FIG. 2A according to an example implementation of the present disclosure.

DETAILED DESCRIPTION

Figure 1:
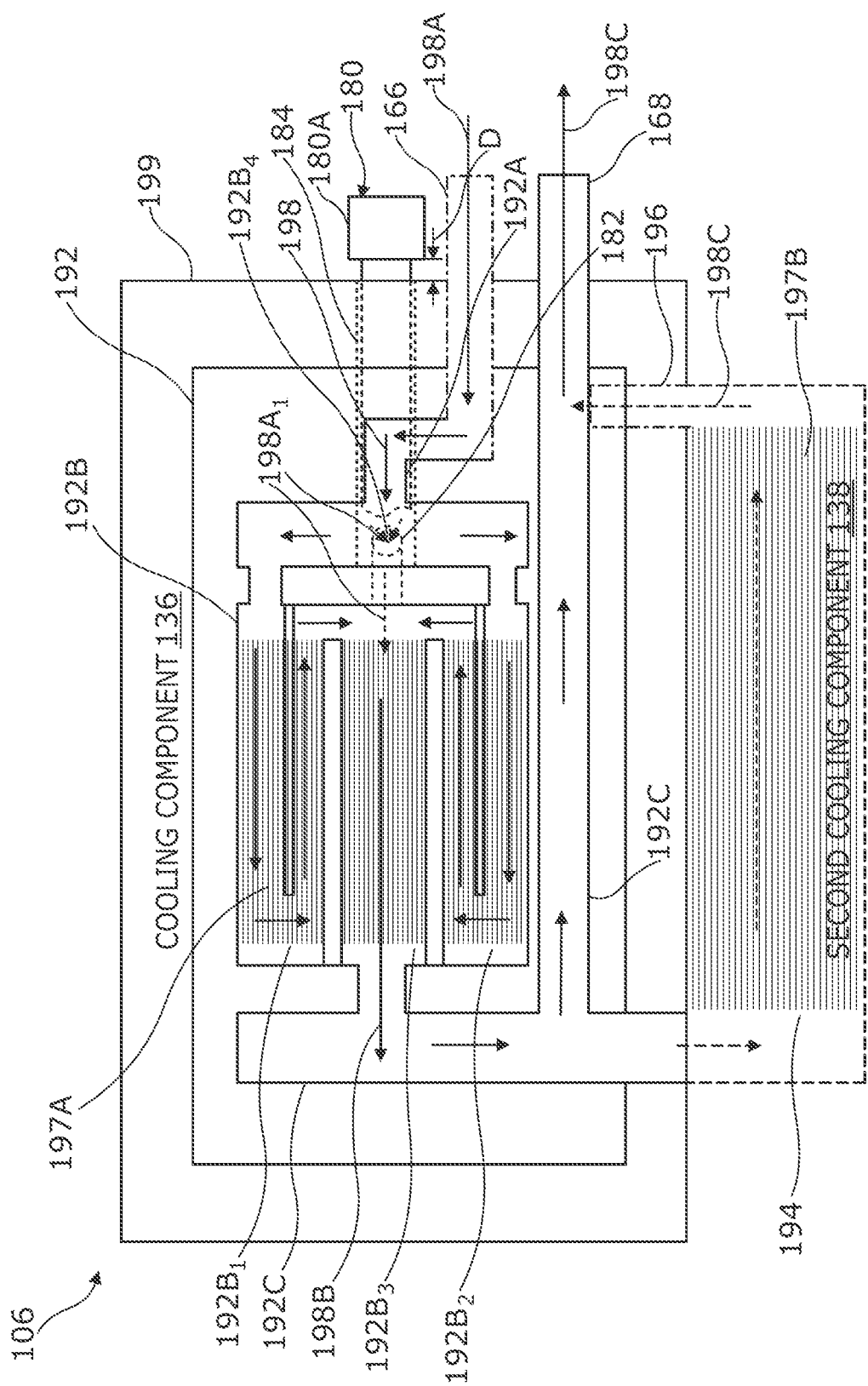
FIG. 1 illustrates a block diagram of a cooling module according to an example implementation of the present disclosure.

The following detailed description refers to the accompanying drawings. For purposes of explanation, certain examples are described with reference to the components illustrated in FIGS. 1-6. The functionality of the illustrated components may overlap, however, and may be present in a fewer or greater number of elements and components. Moreover, the disclosed examples may be implemented in various environments and are not limited to the illustrated examples. Further, the sequence of operations described in connection with FIG. 6 is an example and is not intended to be limiting. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

As used herein, to "thermally couple" two objects means to provide a thermally conductive pathway between the objects that allows heat to be conducted between the objects. Two objects may be considered to be thermally coupled if any of the following are true: (1) the two objects are in contact with one another (either direct contact, or contact via a TIM), (2) the objects are both thermally coupled to a thermally conductive intermediary (e.g., a heat pipe, heat spreader, etc.) (or to a chain of thermally conductive intermediaries thermally coupled together), or (3) a heat transfer coefficient between the two objects is 5 $W \cdot m^{-2} \cdot K^{-1}$ or greater. As used herein, "electronic device" refers to devices such as a computer, a networking device, a power conversion device, or the like having a circuit assembly, one or more circuit modules, and one or more cooling modules. As used herein, "circuit assembly" refers to an electronic circuit having a printed circuit board and one or more electronic components, such as capacitors, resistors, or the like. As used herein, "circuit module" refers to an electronic module having a substrate and a plurality of chipsets mounted on the substrate. The term "cold plate" is sometimes used in the art with varying meanings, with some meanings being more generic and others being more specific. As used herein "cold plate" refers specifically to a subset of thermal devices that are configured to receive heat from at least one component (e.g., a chipset) via conduction and to dissipate that heat into a flow of liquid coolant (e.g., water), in contrast to a "heat sink" which as used herein refers specifically to a subset of thermal devices that are configured to receive heat from at least one component via conduction and dissipate that heat into gas (e.g., air). As used herein, "coolant" refers to a type of fluid, which is used to absorb waste heat from a heat source such as a circuit module or from a cooling component thermally coupled to the circuit module.

An electronic device, such as a computer (e.g., server, storage device, etc.), a networking device (e.g., wireless access point, router, switch, etc.), or the like, may include a circuit assembly and least one circuit module coupled to the circuit assembly. The circuit assembly may include a circuit board, e.g., a mother board and a plurality of electronic components, e.g., capacitors, resistors, or the like. The circuit module may be coupled to the circuit board via solder balls, for example. The circuit module may include a substrate and multiple chipsets disposed on the substrate. Each chipset of the multiple chipsets may include a first chip and optionally a plurality of second chips disposed partially surrounding the first chip. It may be noted herein that the term "first chip" and "second chip" may be used interchangeably without deviating from the scope of the present disclosure. The first chip may include, but is not limited to, a central processing unit (CPU), a graphics processing unit (GPU), or the like. Each of the plurality of second chips may include, but is not limited to, a power supply chip, a memory chip, or the like. During the operation of the circuit assembly, one or more chips in the circuit module may generate waste heat. Such waste heat is undesirable because it may negatively impact the operation of the circuit assembly. For example, waste heat may cause physical damage to the one or more chips, degrade performance, reliability, or life expectancy of the circuit module, and in some cases waste heat may even cause failure of the circuit assembly. To overcome such issues of waste heat in the circuit module having one or more chips, the electronic device may include a thermal management system to remove the waste heat from the one or more chips. For example, the thermal management system may include a cold plate and a coolant distribution unit (CDU) for removing the waste heat from the chipsets. The cold plate may be thermally coupled to the one or more chips and the CDU may be fluidically connected to the cold plate. During the operation of the electronic device, the cold plate conducts the waste heat from the one or more chips and the CDU may direct a flow of coolant (e.g., water) to the cold plate to dissipate the waste heat from the cold plate into the flow of coolant.

However, some electronic devices may include multiple circuit assemblies (e.g., a first circuit assembly and a second circuit assembly), and a plurality of circuit modules (e.g., a first set of circuit modules and a second set of circuit modules). In some examples, the first set of circuit modules (e.g., four circuit modules) may be coupled to the first circuit assembly and the second set of circuit modules (e.g., eight circuit modules) may be coupled to the second circuit assembly. In such examples, the electronic device may further include a plurality of cold plates including a first set of cold plates (e.g., four cold plates) that are thermally coupled to the first set of circuit modules and a second set of cold plates (e.g., eight cold plates) that are thermally coupled to the second set of circuit modules. The CDU may have an inlet manifold to circulate a coolant to each cold plate of the first and second sets of cold plates. For example, the inlet manifold may have a first set of parallel flow paths (e.g., four parallel flow paths) to circulate a first portion of a coolant to the first set of cold plates and a second set of parallel flow paths (e.g., eight parallel flow paths) to circulate a second portion of the coolant to the second set of cold plates. The CDU may be configured to circulate an equal portion of coolant (e.g., one gallon of coolant per minute) to each set of cold plates among the first set of cold plate and the second set of cold plates to efficiently remove waste heat from each set of circuit modules among the first set of circuit modules and the second set of circuit modules. The first portion of the coolant may undergo a greater flow restriction because of the lesser number of parallel flow paths in the first set of parallel flow paths and the lesser number of cold plates in the first set of cold plates. On the other hand, the second portion of the coolant may undergo a lesser flow restriction because of the greater number of parallel flow paths in the second set of parallel flow paths and the greater number of cold plates in the second set of cold plates. Thus, the flow of coolant from the CDU may tend to flow more towards the second set of cold plates having less flow restrictions compared to the first set of cold plates. For example, the first set of cold plates may receive about 0.5 gallon of coolant per minute and the second set of cold plates may receive about 1.5 gallon of coolant per minute from the CDU. Accordingly, a flow imbalance may occur between the first set of cold plates and the second set of cold plates. Therefore, each cold plate of the first set of cold plates may become ineffective to remove waste heat from the one or more chips of each circuit module of the first set of circuit modules. Thus, such waste heat may cause physical damage to the one or more chips of each circuit module of the first set of circuit modules, degrade performance, reliability, or life expectancy of each circuit module of the first set of circuit modules, and in some cases the waste heat may even cause failure of the first circuit assembly.

A technical solution to the aforementioned problems may include providing a cooling module having a bypass screw configured to regulate (e.g., by opening or closing the bypass screw) a portion of a coolant to bypass one or more flow restriction sections in the cooling module. In some examples, the bypass screw of each cooling module of one set of cooling modules (e.g., a first set of cooling modules) may be opened to allow a portion of the coolant to bypass one or more flow restriction sections in the cooling module. However, the bypass screw of each cooling module of another set of cooling modules (e.g., a second set of cooling modules) may be shut to block the coolant from bypassing one or more flow restriction sections in the cooling module. Thus, the bypass screw of each cooling module among the first and second sets of cooling modules may balance the flow of the coolant from a CDU between the first and second sets of cooling modules. Since the bypass screw of each cooling module of the first set of cooling modules creates an additional parallel flow path and allows each portion of the coolant to flow through one or more flow restrictive sections in the respective cooling module, the bypass screws are configured to reduce flow restrictions which are caused due to a lesser number of cooling modules and a lesser number of parallel flow paths in the first set of cooling modules as compared to the second set of cooling modules. Thus, the bypass screws of the first and second sets of cooling modules are configured to maintain the flow balance between the first and second sets of cooling modules.

Accordingly, in one or more examples of the present disclosure, a cooling module for a circuit module, and an electronic device having multiple sets of circuit modules and multiple sets of cooling modules, are disclosed. Each cooling module includes a cooling component and a bypass screw. The cooling component includes a fluid channel having a supply section, a body section, and a return section. The body section is bifurcated into a first body section and a second body section and the first and second body sections are further merged into a third body section. The supply section is connected to the first and second body sections and the return section is connected to the third body section. The bypass screw is movably connected to the cooling component to regulate a portion of the coolant to flow directly from the supply section to the third body section and bypass the first and second body sections.

FIG. 1 depicts a block diagram of a cooling module 106. The cooling module 106 includes a cooling component 136 (e.g., a first cooling component) and a bypass screw 180. It should be understood that FIG. 1 is not intended to illustrate specific shapes, dimensions, or other structural details accurately or to scale, and that implementations of the cooling module 106 may have different numbers and arrangements of the illustrated components and may also include other parts that are not illustrated.

The cooling component 136 is made of a thermally conductive material, such as copper, aluminum, or alloy. The cooling component 136 includes a fluid channel 192 (e.g., a first fluid channel) having a supply section 192A, a body section 192B, and a return section 192C. The body section 192B is bifurcated into a first body section 192B$_1$ and a second body section 192B$_2$. Further, the first body section 192B$_1$ and the second body section 192B$_2$ are merged into a third body section 192B$_3$. The supply section 192A is connected to the body section 192B at a bifurcation region 192B$_4$, where the body section 192B is bifurcated into the first body section 192B$_1$ and the second body section 192B$_2$. The supply section 192A is further fluidically connected to a coolant inlet 166 of the cooling module 106. The return section 192C is fluidically connected to the third body section 192B$_3$ and to a coolant outlet 168 of the cooling module 106. In one or more examples, the cooling component 136 may be mounted on a portion of a circuit module (not shown) having a first chipset (not shown). In such examples, the body section 192B further includes a plurality of first micro channels 197A, which may be thermally coupled to a first chip (e.g., a graphics processing unit (GPU)) and a plurality of second chips (e.g., memory chips) of the first chipset. In some examples, the cooling component 136 further includes a first orifice 182 and a second orifice 184. In some examples, the first orifice 182 extends between the third body section 192A 3 and the bifurcation region 192B$_4$. The second orifice 184 extends inside the cooling component 136 from one peripheral side (not labeled) of the cooling component 136 and intersects the first orifice 182. The bypass screw 180 is movably connected to the cooling component 136 via the second orifice 184.

In some examples, the cooling module 106 may further include a second cooling component 138 made of a thermally conductive material, such as copper, aluminum, or alloy. In one or more examples, each of the first and second cooling components 136 and 138 may function as a cold plate. The cooling component 138 has an intermediate fluid channel 194. In one or more examples, the second cooling component 138 may be fluidically connected to the cooling component 136. For example, the intermediate fluid channel 194 is fluidically connected to the return section 192C and a second fluid channel 196 of the cooling component 136. In one or more examples, the second cooling component 138 may be mounted on another portion of the circuit module having a second chipset (not shown). In such examples, the intermediate fluid channel 194 further includes a plurality of second micro channels 197B, which may be thermally coupled to a second chip (e.g., a central processing unit (CPU)) of the second chipset.

During the operation of an electronic device (not shown in FIG. 1), the first chipset and the second chipset of the circuit module may generate waste heat. The body section 192B and the intermediate fluid channel 194, which are thermally coupled to the first chipset and the second chipset respectively, may absorb the waste heat from the first chipset and the second chipset. In such examples, the cooling module 106 may receive coolant 198A from a central distribution unit (CDU) to dissipate the waste heat from the cooling component 136. For example, the coolant 198A may flow from the coolant inlet 166 to the coolant outlet 168 through i) the supply section 192A, the first and second body sections 192B$_1$ and 192B$_2$, the third body section 192B$_3$, the return section 192C, and a second fluid channel 196 of the cooling component 136. In such examples, the coolant may absorb the waste heat from the first chipset via the second body section 192B$_2$ and becomes a partially heated coolant 198B. In some examples, the partially heated coolant 198B may additionally flow from the cooling component 136 to the second cooling component 138 via the return section 192C. For example, the partially heated coolant 198B may flow from the return section 192C to the intermediate fluid channel 194, and from intermediate fluid channel 194 to the second fluid channel 196 of the cooling component 136. In such examples, the partially heated coolant 198B may further absorb the waste heat from the second chipset via the intermediate fluid channel 194 and becomes a heated coolant 198C. Further, the heated coolant 198C may be discharged from the cooling module 106 to the CDU via the coolant outlet 168. In some examples, the bypass screw 180, which is movably connected to the cooling component 136 via the second orifice 184, may regulate a portion 198A$_1$ of the coolant 198A to flow directly from the supply section 192A to the third body section 192B$_3$ and bypass the first and second body sections 192B$_1$ and 198B$_2$. For example, the bypass screw 180 may move outside (e.g., partially outside) of the second orifice 184 to uncover the first orifice 182 and allow the portion 198A$_1$ of the coolant 198A to flow directly from the supply section 192A to the third body section 198B$_3$. It may be noted herein a head portion 180A of the bypass screw 180 moving a distance "D" away from a peripheral side portion 199 of the cooling component 136 denotes the partial movement of the bypass screw 180 outside of the second orifice 184. In some other examples, the bypass screw 180 may move inside (e.g., entirely inside) the second orifice 184 to cover the first orifice 182 and prevent the portion 198A$_1$ of the coolant 198A from flowing directly from the supply section 192A to the third body section 192B$_3$. For example, the head portion 180A of the bypass screw 180 contacts the peripheral side portion 199 of the cooling component 136 when the bypass screw 180 moves entirely inside the second orifice 184.

Figure 2A:
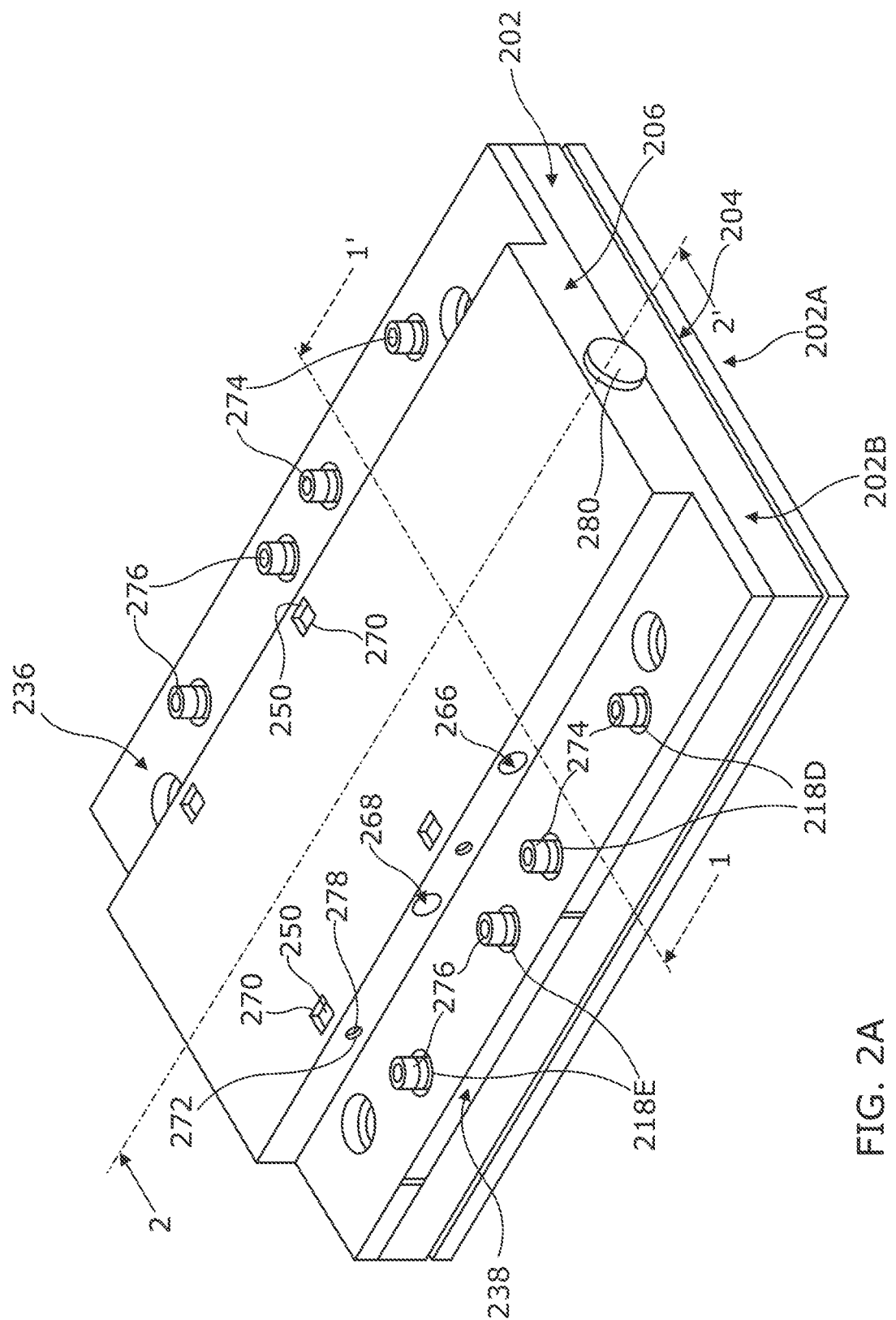
FIG. 2A illustrates an assembled perspective view of a cooling module and a circuit module to a frame of an electronic device according to an example implementation of the present disclosure.
Figure 2C:
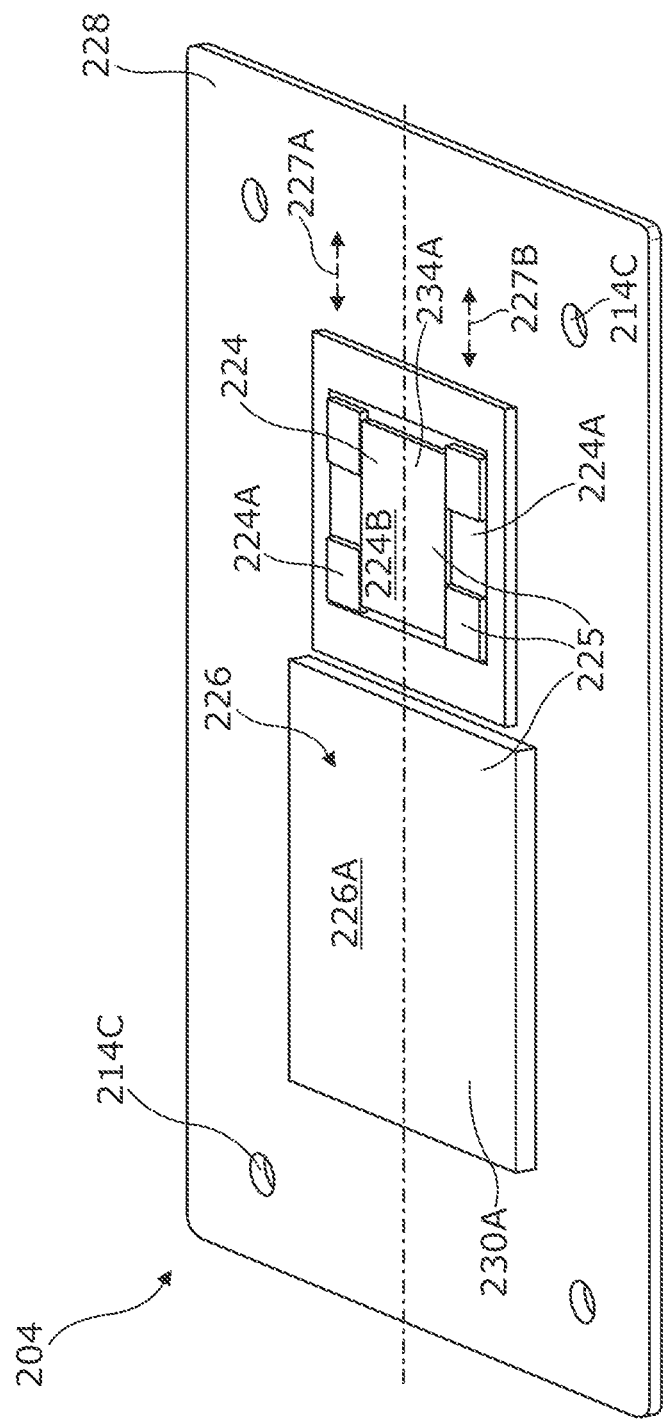
FIG. 2C illustrates a perspective view of a circuit module of FIG. 2A according to an example implementation of the present disclosure.
Figure 2F:
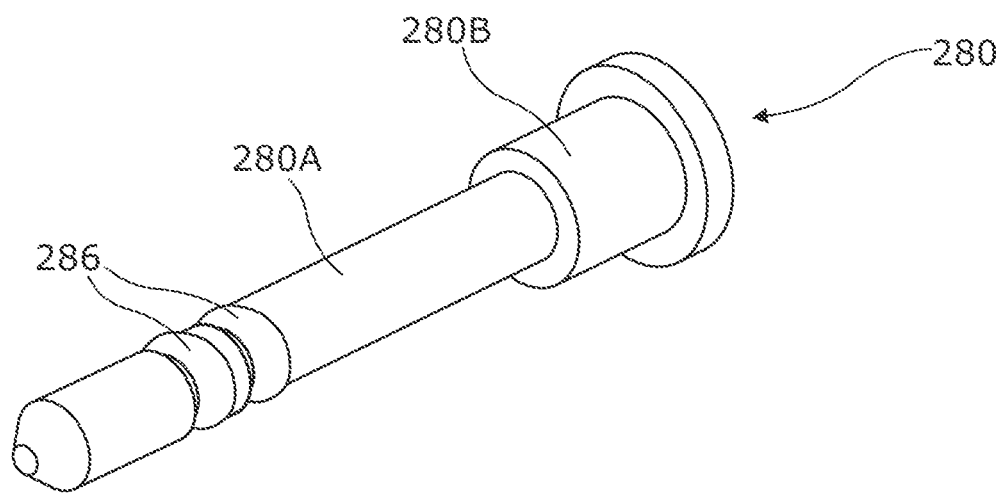
FIG. 2F illustrates a perspective view of a bypass screw of the cooling module of FIG. 2A according to an example implementation of the present disclosure.

FIG. 2A depicts an assembled perspective view of a circuit module 204 and a cooling module 206 to a frame 202 of an electronic device. FIG. 2B depicts an exploded perspective view of the frame 202 of FIG. 2A. FIG. 2C depicts a perspective view of a circuit module 204 of FIG. 2A. FIG. 2D depicts an exploded perspective top view of a cooling module 206 of FIG. 2A. FIG. 2E depicts an exploded perspective bottom view of a cooling module 206 of FIG. 2A. FIG. 2F depicts a perspective view of a bypass screw 280 of the cooling module 206. In the description hereinafter, FIGS. 2A-2F are described concurrently for ease of illustration.

Referring to FIG. 2A, the circuit module 204 is coupled to the frame 202 of an electronic device (not shown). In particular, the circuit module 204 is sandwiched between a base portion 202A and a cover portion 202B of the frame 202. The cooling module 206 is assembled on the circuit module 204 and connected to the frame 202. In particular, the cooling module 206 is mounted on the cover portion 202B of the frame 202 such that the cooling module 206 is thermally coupled to the circuit module 204. The process of coupling the circuit module 204 to the frame 202, mounting the cooling module 206 to the frame 202, and thermally coupling the cooling module 206 to the circuit module 204 are discussed in greater details below.

Referring to FIG. 2B, the frame 202 may function as a stiffener and a heat transfer plate of the electronic device. In some examples, the frame 202 includes a base portion 202A and a cover portion 202B. The base portion 202A is an open-box shaped element. In such examples, the base portion 202A has a floor section 212A for supporting a portion of a substrate 228 of the circuit module 204 and an opening 210A for allowing electrical contacts in a substrate 228 (as shown in FIG. 2C) of the circuit module 204 to protrude outside the frame 202. In some examples, the electrical contacts may allow the substrate 228 to be coupled to a circuit board of a circuit assembly (not shown). The floor section 212A of the base portion 202A includes a plurality of first clamping holes 214A. Further, the base portion 202A may include a plurality of retainer holes (not shown) formed in the floor section 212A. In such examples, the plurality of retainer holes may be used to clamp the frame 202 to the circuit board of the circuit assembly. In some examples, the cover portion 202B is another open-box shaped element. In such examples, the cover portion 202B has an opening 210B formed in a lid section 212B of the cover portion 202B for allowing first and second chipsets 224 and 226 (as shown in FIG. 2C) of the circuit module 204 to protrude outside the cover portion 202B. In some examples, the first and second chipsets 224, 226 protruding outside the cover portion 202B may allow the circuit module 204 to be thermally coupled to the cooling module 206. For example, the opening 210B may be formed substantially at a center portion of the lid section 212B. Additionally, the lid section 212B includes a plurality of first holes 218A, a plurality of second holes 218B, and a plurality of second clamping holes 214B. In some examples, each hole of the plurality of second clamping holes 214B is aligned to a respective hole of the plurality of first clamping holes 214A in the base portion 202A. In one or more examples, the cover portion 202B may be mounted on and coupled to the base portion 202A to form the frame 202.

Referring to FIG. 2C, the circuit module 204 may function as a multi-chip module of the electronic device. In some examples, the circuit module 204 includes a first chipset 224, a second chipset 226, and a substrate 228. In some examples, the substrate 228 is a semiconductor wafer, which has one or more layers, and may function as a base board for fabrication of the first and second electronic chipsets 224 and 226 on one side of the semiconductor wafer, and connecting the first and second chipsets 224, 226 to electrical contacts on another side of the semiconductor wafer. In some examples, the first and second chipsets 224 and 226 are positioned adjacent to each other and disposed on and coupled to the substrate 228. For example, the first and second chipsets 224 and 226 may be coupled to the substrate 228 by solder bumps. In some examples, the first chipset 224 includes a plurality of first chips 224A and a second chip 224B. Similarly, the second chipset 226 includes a third chip 226A. It may be noted herein that the plurality of first chips 224A, the second chip 224B, and the third chip 226A may be collectively referred to as electronic chips 225. Examples of the electronic chips 225 may include, but are not limited to, a central processing unit (CPU), a graphics processing unit (GPU), a power supply chip, a memory chip, or the like. In the illustrated example, each of the plurality of first chips 224A is a memory chip, the second chip 224B is a GPU, and the third chip 226A is a CPU. The plurality of first chips 224A are arranged along a first row 227A and a second row 227B located around the second chip 224B. In one or more examples, a top surface of the first chipset 224 functions as a first thermal interfacing surface 234A of the circuit module 204 and a top surface of the second chipset 230 functions as a second thermal interfacing surface 230A of the circuit module 204. It is to be noted that the circuit module 204 may include various combinations of different types of electronic chips 225, without limiting the scope of the present disclosure. Further, while the circuit module 204 is shown to include three types of electronic chips 225 arranged in a specific fashion, the scope of the present disclosure is not limited with respect to the number or types of electronic chips 225 and the manner in which the electronic chips 225 are laid out on the substrate 228. The substrate 228 additionally includes a plurality of third clamping holes 214C, each aligned to respective holes of the plurality of first and second clamping holes 214A and 214B of the frame 202.

Figure 3:
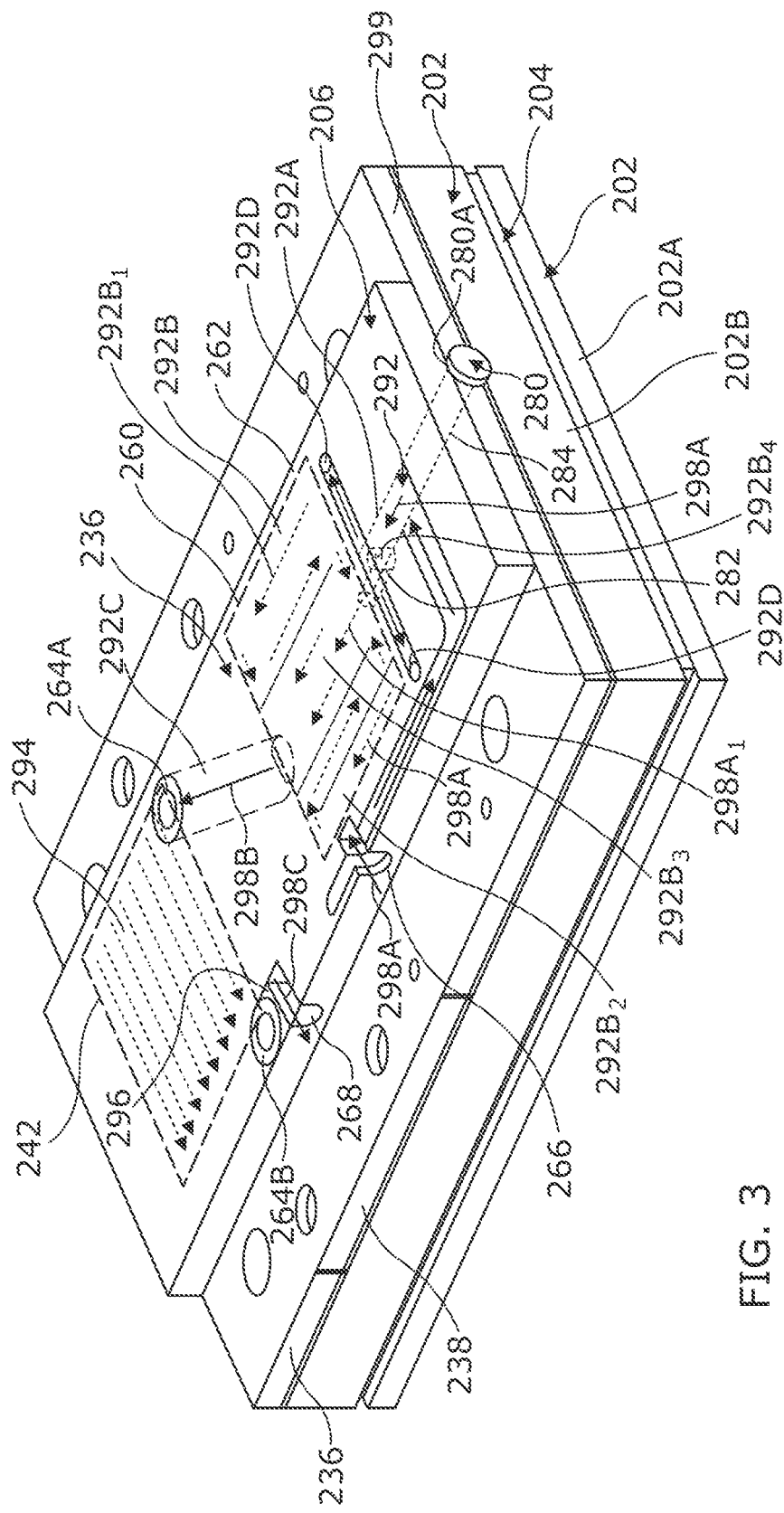
FIG. 3 illustrates a cross sectional top view of the cooling module taken along line 1-1' in FIG. 2A according to an example implementation of the present disclosure.

Referring to FIGS. 2D-2E, the cooling module 206 functions as a fluid cooling module, by circulating a coolant 298A (as shown in FIG. 2E and FIG. 3) to absorb the waste heat from the electronic chips and become a heated coolant 298C (as shown in FIG. 3). The coolant 298A may include about 25 percent of propylene glycol and 75 percent of water. In some examples, the temperature of the coolant 298A may be about 36 degrees Celsius, the temperature of the heated coolant 298C may be about 60 degrees Celsius, and a temperature of a facility fluid (not shown) may be about 32 degrees Celsius. It may be noted herein the facility fluid may refer to an external fluid used to indirectly cool the heat coolant 298C In one or more examples, the CDU may include at least one heat exchanger system to enable transfer of waste heat from the heated coolant 298C to the facility fluid, thereby cooling the heated coolant 298C to become the coolant 298A (i.e., cooling the heated coolant 298C to return to a cooled state). The cooling module 206 includes a cooling component 236 (e.g., a cooling component), a second cooling component 238, and a bypass screw 280.

The cooling component 236 includes a pair of first flange portions 252, a recess portion 254 located between the pair of first flange portions 252, and a pair of first fluid connectors 264. In some examples, the cooling component 236 has a top surface 256 and a bottom surface 258. The cooling component 236 further includes a first cooling portion 260 and a third cooling portion 262. In some examples, the first cooling portion 260 is formed at the bottom surface 258 corresponding to a portion of a first flange 252A of the pair of first flange portions 252. In such examples, the first cooling portion 260 protrudes outwards from the bottom surface 258 of the cooling component 236. In one or more examples, a bottom surface of the first cooling portion 260 functions as a first thermal interfacing surface 260A of the cooling module 206. The third cooling portion 262 is formed on the top surface 256 of the cooling component 236. For example, the third cooling portion 262 protrudes outwards from the top surface 256 and extends between the pair of first flange portions 252 and the recess portion 254. The cooling component 236 further includes a coolant inlet 266 and a coolant outlet 268 spaced apart from each other and formed in a first peripheral wall 262A of the third cooling portion 262.

In one or more examples, the pair of first fluid connectors 264 is formed at the bottom surface 258. For example, the pair of first fluid connectors 264 is located at the recess portion 254, where each connector of the pair of first fluid connectors 264 protrudes inwards towards the third cooling portion 262 from the recess portion 254. In some examples, the pair of first fluid connectors 264 includes a first connector 264A, and a second connector 264B. In one or more examples, the first connector 264A may be fluidically connected to the fluid inlet 266 via a first fluid channel 292 (as shown in FIGS. 5A-5B) formed within the first cooling portion 260 and the third cooling portion 262 of the cooling component 236. Similarly, the second connector 264B may be fluidically connected to the fluid outlet 268 via a second fluid channel 296 (as shown in FIGS. 5A-5B) formed within the third cooling portion 262 of the cooling component 236. In the examples of FIGS. 2D-2E, each connector of the pair of first fluid connectors 264 is the fluid bore.

The cooling component 236 further includes a plurality of fourth holes 218D formed in the first flange 252A of the pair of first flange portions 252. In one or more examples, each fourth hole of the plurality of fourth holes 218D is aligned with a respective second hole of the plurality of second holes 218B formed in the cover portion 202B of the frame 202. In some examples, the cooling component 236 further includes a plurality of fifth holes 218E formed in the recess portion 254. Additionally, the cooling component 236 includes a plurality of fourth clamping holes 214D. Each hole of the plurality of fourth clamping holes 214D is aligned to a respective hole of the plurality of second clamping holes 214B formed in the cover portion 202B of the frame 202.

The cooling component 236 additionally includes a plurality of retention holes 270 spaced apart from each other, and formed on the third cooling portion 262 of the cooling component 236. For example, each retention hole of the plurality of retention holes 270 is located in the recess portion 254 and extends along the third cooling portion 262. Each retention hole of the plurality of retention holes 270 is aligned to a respective retention tab of the plurality of retention tabs 250 formed in the second cooling component 238.

The cooling component 236 further includes a plurality of fastener holes 272 formed in peripheral walls of the third cooling portion 262. For example, one pair of fastener holes 272A is formed in the first peripheral wall 262A of the third cooling portion 262 and another pair of fastener holes (not shown) is formed in a second peripheral wall 262B of the third cooling portion 262. In some examples, each hole of the plurality of fastener holes 272 may extend up to a respective retention hole of the plurality of retention holes 270.

In one or more examples, the second cooling component 238 includes a pair of second flange portions 240, a second cooling portion 242 located between the pair of second flange portions 240, and a pair of second fluid connectors 248. In some examples, the second cooling component 238 has a top surface 244 and a bottom surface 246. In such examples, the second cooling portion 242 is formed at the bottom surface 246. For example, the second cooling portion 242 protrudes outwards from the bottom surface 246 of the second cooling component 238. In one or more examples, a bottom surface of the second cooling portion 242 functions as a second thermal interfacing surface 242A of the cooling module 206.

In some examples, the pair of second fluid connectors 248 is formed at the top surface 244 of the second cooling component 238. For example, the pair of second fluid connectors 248 protrudes outwards from the top surface 244. The pair of second fluid connectors 248 includes another first connector 248A of the pair of second fluid connectors 248, and another second connector 248B of the pair of second fluid connectors 248. In one or more examples, the other first connector 248A of the second cooling component 238 is aligned with the first connector 264A of the cooling component 236. Similarly, the other second connector 248B of the second cooling component 238 is aligned with the second connector 264B of the cooling component 236. In one or more examples, the pair of second fluid connectors 248 may be fluidically connected to an intermediate fluid channel 294 formed within the second cooling portion 242 of the second cooling component 238. For example, the other first connector 248A may be connected to one end portion (not shown) of the intermediate fluid channel 294, and the other second connector 248B may be connected to another end (not shown) of the intermediate fluid channel 294. In the examples of FIGS. 2D-2E, each connector of the pair of second fluid connectors 248 is the fluid piston.

The second cooling component 238 further includes a plurality of third holes 218C. For example, each flange of the pair of second flange portions 240 may include a pair of third holes among the plurality of third holes 218C. In one or more examples, each third hole of the plurality of third holes 218C is aligned with a respective first hole of the plurality of first holes 218A formed in the cover portion 202B of the frame 202. Further, each third hole of the pair of third holes 218C is aligned to a respective fifth hole of the plurality of fifth holes 218E formed in the cooling component 236. The second cooling component 238 further includes a plurality of retention tabs 250 spaced apart from each other and formed on the top surface 244 of the second cooling component 238. For example, each retention tab of the plurality of retention tabs 250 extends outwards from the top surface 244 of the second cooling component 238.

Referring back to FIG. 2A, the cooling module 206 further includes a plurality of first spring loaded fasteners 274 and a plurality of second spring loaded fasteners 276. In one or more examples, each fastener of the plurality of first spring loaded fasteners 274 may be inserted through respective holes of the plurality of fourth and second holes 218D and 218B to connect the cooling component 236 to the frame 202. Similarly, each fastener of the plurality of second spring loaded fasteners 276 may be inserted through respective holes of the plurality of third and first holes 218C and 218A to connect the second cooling component 238 to the frame 202.

Referring back to FIGS. 2D-2E, the cooling module 206 further includes a plurality of fasteners 278. In some examples, each fastener 278 may be inserted inside a corresponding fastener hole 272 formed in the cooling component 236 to get each fastener 278 to engage with the retention tab 250 of the second cooling component 238 in order to couple the cooling component 236 and the second cooling component 238 to one another.

Figure 4:
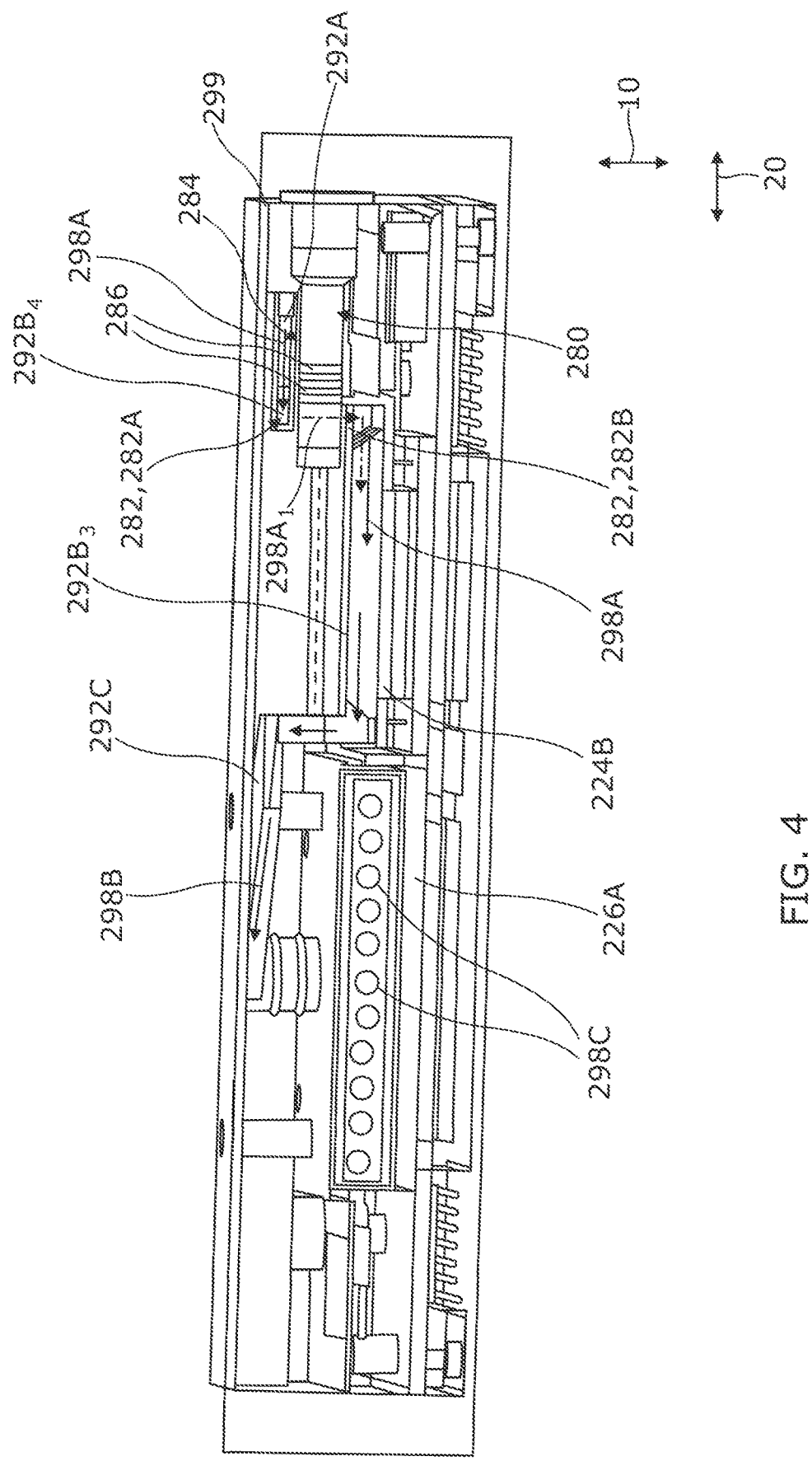
FIG. 4 illustrates a cross sectional side view of the cooling module and the circuit module taken along line 2-2' in FIG. 2A according to an example implementation of the present disclosure.
Figure 5:
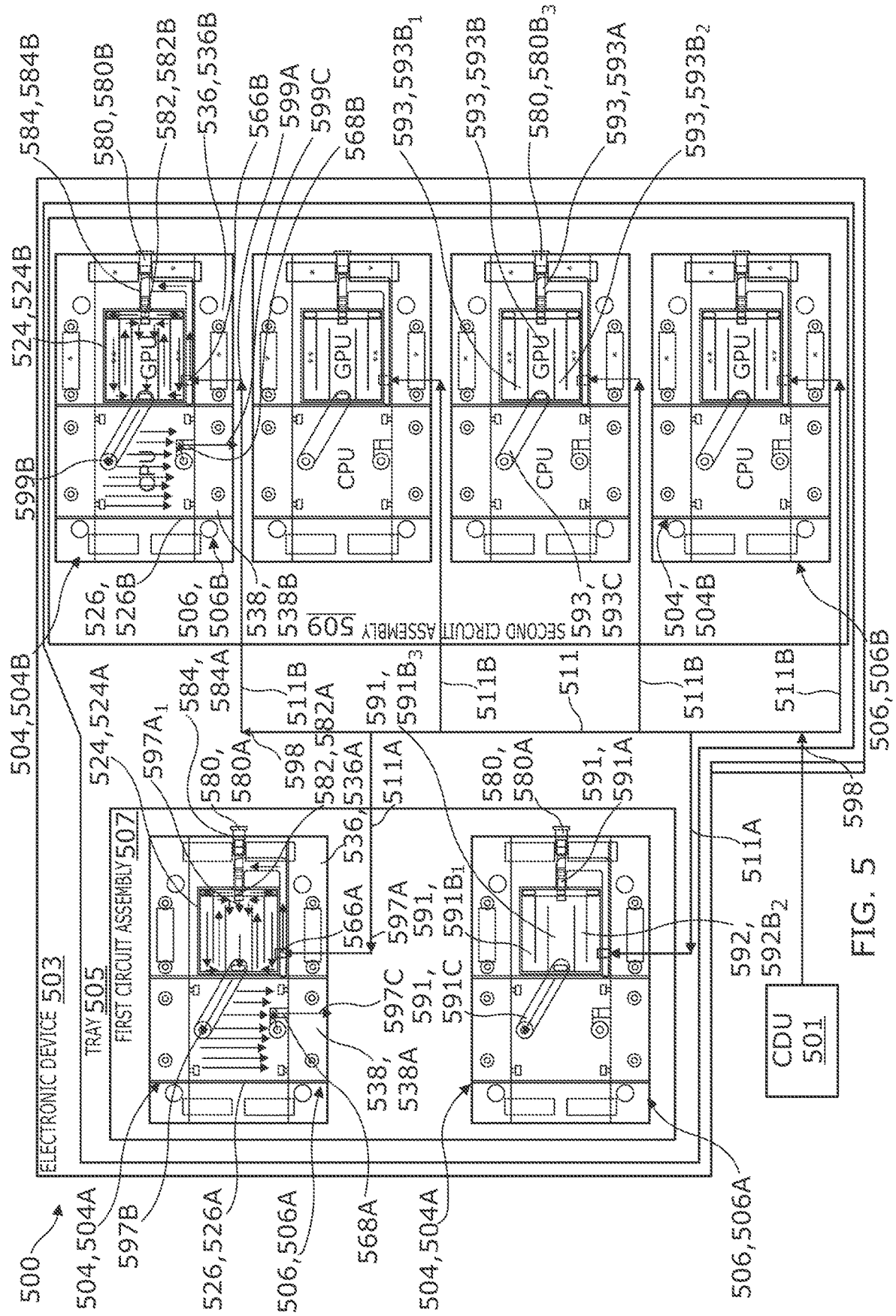
FIG. 5 depicts a block diagram of a portion of a datacenter environment having a coolant distribution unit and an electronic device having a first circuit assembly, a second circuit assembly, a plurality of circuit modules, and a plurality of cooling modules according to an example implementation of the present disclosure.
Figure 6:
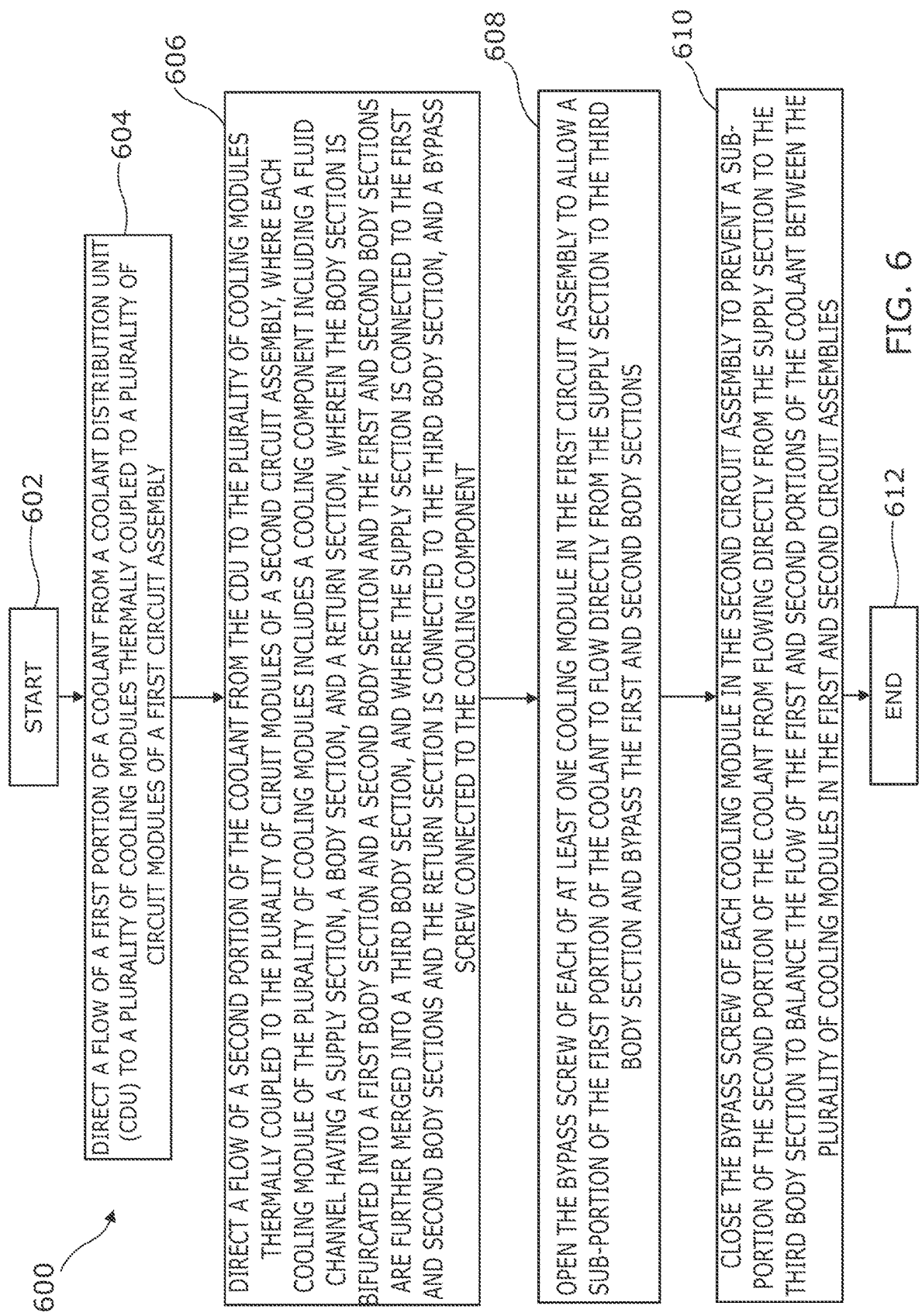
FIG. 6 depicts a method of balancing a flow of coolant between a plurality of cooling modules in a first circuit assembly and a second cooling assembly according to an example implementation of the present disclosure.

The cooling component 236 may further include a first orifice 282 and a second orifice 284 (as shown in FIGS. 3-5). In some examples, the first orifice 282 may be plain orifice (e.g., non-threaded) and the second orifice 284 may have threads. In such examples, the bypass screw 280 is movably connected to the cooling component 236. The first orifice 282 and the second orifice 284 formed in the cooling component 236 are discussed in greater details in FIGS. 3-5. Referring to FIG. 2F, the bypass screw 280 may be a cylindrical component having a body portion 280A and a head portion 280B extending from the body portion 280A. In some examples, the body portion 280A may have threads to enable the bypass screw 280 to be movably coupled (e.g., screwed) to the second orifice 284. Further, the bypass screw 280 may include one or more O-ring seals 286 to prevent leakage of a portion of the coolant 278 from the second orifice 284.

Referring to FIGS. 2A-2F, during assembly of the cooling module 206, the circuit module 204 is disposed on the base portion 202A of the frame 202 such that a peripheral portion of the substrate 228 is seated on the floor section 212A and a mid-portion of the substrate 228 having the electrical contacts are accessible from the opening 210A. Further, each hole of the plurality of third clamping holes 214C is aligned to the respective hole of the plurality of first clamping holes 214A. Further, the cover portion 202B of the frame 202 is mounted in the base portion 202A such that the first electronic chipset 224 and the second electronic chipset 226 are accessible from the opening 210B. Further, each second hole of the plurality of second clamping holes 214B is aligned to the respective hole of the plurality of third clamping holes 214C. Later, a clamping fastener of a plurality of clamping fasteners (not shown) is inserted into the second clamping hole 214B in the cover portion, the third clamping hole 214C in the substrate, and the first clamping hole in the base portion 214A to couple the cover portion 202B to the base portion 202A and form the frame 202 having the circuit module 204 sandwiched therebetween.

The second cooling component 238 is mounted on the frame 202 such that the second cooling portion 242 of the second cooling component 238 faces the second electronic chipset 226 of the substrate 228. In some examples, upon mounting of the second cooling component 238 on the frame 202, the second thermal interfacing surface 242A of the second cooling component 238 may align with the second thermal interfacing surface 230A (as shown in FIG. 2C) of the second electronic chipset 226. Further, a fastener of the plurality of second spring loaded fasteners 276 is inserted into the third hole 218C in the second cooling component 238 and the first hole 218A in the cover portion 202B to connect the second cooling component 238 to the frame 202. In some examples, each spring of the plurality of second spring loaded fasteners 276 may bias the second cooling component 238 to move towards the second electronic chipset 226, and thermally couple the second thermal interfacing surface 242A of the second cooling component 238 with the second thermal interfacing surface 230A of the second electronic chipset 226.

Further, the cooling component 236 is positioned over the second cooling component 238 such that the plurality of retention holes 270 in the cooling component 236 is aligned with the plurality of retention tabs 250 of the second cooling component 238. Later, the cooling component 236 is mounted on the frame 202 with the first cooling portion 260 of the cooling component 236 facing the first electronic chipset 224 of the substrate 228. In such examples, when the cooling component 236 is mounted on the frame 202, the second cooling component 238 is positioned within the recess portion 254 of the cooling component 236, and each retention tab of the plurality of retention tabs 250 protrudes along a respective hole of the plurality of retention holes 270.

Further, upon mounting of the cooling component 236 on the frame 202, as discussed herein, each connector of the pair of first fluid connectors 264 in the cooling component 236 is movably connected to a respective connector of the pair of second fluid connectors 248 in the second cooling component 238 to establish a fluid-flow path 390 (see, FIG. 3) between the first and second cooling components 236 and 238. For example, the first connector 264A of the pair of first fluid connectors 264 is movably connected to the other first connector 248A of the pair of second fluid connectors 248 to establish an inlet fluid-flow path 390A (see, FIG. 3) between the first and second cooling components 236 and 238. Similarly, the second connector 264B of the pair of first fluid connectors 264 is movably connected to the other second connector 248B of the pair of second fluid connectors 248 to establish an outlet fluid-flow path 390B (see, FIG. 3) between the first and second cooling components 236 and 238. Further, upon mounting of the cooling component 236 on the frame 202, the first thermal interfacing surface 260A of the cooling component 136 may align with the first thermal interfacing surface 234A of the first electronic chipset 224. Further, a fastener of the plurality of first spring loaded fasteners 274 is inserted into the fourth hole 218D in the cooling component 236 and the second hole 218A in the cover portion 202B to connect the cooling component 236 to the frame 202. In some examples, each spring of the plurality of first spring loaded fasteners 274 biases the cooling component 236 to move towards the first electronic chipset 224, and thermally couple the first thermal interfacing surface 260A of the cooling component 236 with the first thermal interfacing surface 234A of the first electronic chipset 224. The bypass screw 280 may be movably connected to the cooling component 236.

FIG. 3 depicts a cross sectional top view of the cooling module 206 taken along line 1-1' in FIG. 2A. In particular, FIG. 3 depicts a cross sectional top view of a cooling component 236 (e.g., a first cooling component) and a second cooling component 238 in the cooling module 206.

The cooling component 236 includes a fluid channel 292 (e.g., a first fluid channel) having a supply section 294A, a body section 292B, and a return section 292C. The supply section 294A and the return section 292C are formed within a third cooling portion 262 (as shown in FIG. 2D) and the body section 292B is formed within a first cooling portion 260. The body section is bifurcated into a first body section $292B_1$ and a second body section $292B_2$. The first body section $292B_1$ and the second body section $292B_2$ are further merged into a third body section $292B_3$. The supply section 292A is connected to the body section 292B at a bifurcation region $292B_4$, where the body section 292B is bifurcated into the first body section $292B_1$ and the second body section $292B_2$. The supply section 292A is further fluidically connected to a coolant inlet 266 of the cooling module 206. The return section 292C is fluidically connected to the third body section $292B_3$. In one or more examples, the cooling component 236 may be mounted on a portion of the circuit module 204 having a first chipset 224 (as shown in FIG. 2C). In such examples, the body section 292B further includes a plurality of first micro channels (not shown), which may be thermally coupled to a plurality of first chips 224A (e.g., memory chips, as shown in FIG. 2C) and a second chip 224B (e.g., a graphics processing unit (GPU), as shown in FIG. 2C) of the first chipset 224. In some examples, the cooling component 236 further includes a first orifice 282 and a second orifice 284. In some examples, the first orifice 282 extends between the third body section $292A_3$ and the bifurcation region $292B_4$. The second orifice 284 extends inside the cooling component 236 from a peripheral side portion, e.g., a peripheral side portion 299 of the cooling component 236 and intersects the first orifice 282. The bypass screw 280 is movably connected to the cooling component 236 via the second orifice 284.

The second cooling component 238 has an intermediate fluid channel 294. The intermediate fluid channel 294 is formed within a second cooling portion 242 of the second cooling component 238. In one or more examples, the second cooling component 238 may be fluidically connected to the cooling component 236. For example, the intermediate fluid channel 294 is fluidically connected to the return section 292C and a second fluid channel 296 of the cooling component 236. In one or more examples, the second cooling component 238 may be mounted on another portion of the circuit module having a second chipset (as shown in FIG. 2C). In such examples, the intermediate fluid channel 294 further includes a plurality of second micro channels (not shown), which may be thermally coupled to a second chip (e.g., a central processing unit (CPU), 226A) of the second chipset 226.

During the operation of an electronic device (not shown), the first chipset 224 and the second chipset 226 of the circuit module 204 may generate waste heat. The body section 292B and the intermediate fluid channel 294, which are thermally coupled to the first chipset 224 and the second chipset 226, respectively, may absorb the waste heat from the first chipset 224 and the second chipset 226. In such examples, the cooling module 206 may receive coolant 298A from a central distribution unit (CDU) to dissipate the waste heat from the cooling component 236 and the second cooling component 238. For example, the coolant 298A may flow from the inlet 266 to the outlet 268 through i) the supply section 292A, the first and second body sections $292B_1$ and $292B_2$, the third body section $292B_3$, the return section 292C of the cooling component 236, the intermediate fluid channel 294 of the second cooling component 238, and the second fluid channel 296 of the cooling component 236. In such examples, the coolant may absorb the waste heat from the first chipset via the second body section $292B_2$ and become a partially heated coolant 298B. The partially heated coolant 298B may further absorb the waste heat from the second chipset via the intermediate fluid channel 294 and become a heated coolant 298C. Further, the heated coolant 298A may be discharged from the cooling module 206 to the CDU via the coolant outlet 268.

In some examples, the bypass screw 280, which is movably connected to the cooling component 236 via the second orifice 282 may regulate a portion $298A_1$ of the coolant 298A to flow directly from the supply section 292A to the third body section $292B_3$ and bypass the first and second body section $292B_1$ and $298B_2$. For example, the bypass screw 280 may move outside (e.g., partially outside) the second orifice 282 to uncover the first orifice 282 and allow the portion 298A of the coolant 298 to flow directly from the supply section 292A to the third body section $298B_3$. As shown in FIG. 1, a head portion 280A of the bypass screw 280 may move a distance "D" away from the peripheral side portion 299 of the cooling component 236 to denote the partial movement of the bypass screw 280 outside the second orifice 284. In some other examples, the bypass screw 280 may move inside (e.g., entirely inside) the second orifice to cover the first orifice 282 and prevent the portion $298A_1$ of the coolant 298 from flowing directly from the supply section 292A to the third body section $292B_3$. For example, the head portion 280A of the bypass screw 280 contacts the peripheral side portion 299 of the cooling component 236 when the bypass screw 280 moves entirely inside the second orifice 284.

FIG. 4 depicts a cross sectional side view of the cooling module 206 and the circuit module 204 taken along line 2-2' in FIG. 2A.

In the example of FIG. 4, the first orifice 282 extends from a bifurcation region $292B_4$ into the third body section $292B_3$. For example, a portion 282A of the first orifice 282 protrudes along a vertical direction 10 from the bifurcation region $292B_4$ and another portion 282B of the first orifice 282 protrudes along a horizontal direction 20 from the third body section $292B_3$ and such portion 282A and the other portion 282B of the first orifices 282 are connected to one another to define the first orifice 282. The second orifice 284 extends from a peripheral side portion 299 of the cooling component 236 and intersects the portion 282A of the first orifice 282. In the example of FIG. 4, the bypass screw 280 is movably coupled to the cooling component 236 via the second orifice 284. In such examples, the bypass screw 280 moves entirely inside the second orifice 284 to cover the portion of the first orifice 282 and prevent the portion $298A_1$ of the coolant 298A from flowing directly from the supply section 292A to the third body section $292B_3$. In some other examples, the bypass screw 280 moves at least partially outside the second orifice 284 to uncover the portion of the first orifice 282 and allow the portion $298A_1$ of the coolant 298A from flowing directly from the supply section 292A to the third body section $292B_3$. In some examples, the bypass screw 280 may be used to balance a flow of coolant 298 (e.g., provide equal volume of coolant 298) from a coolant distribution unit (CDU) between multiple cooling modules 206. As discussed herein, the coolant 298A flows along the third body section $292B_3$ from the first and second body sections $292B_1$, $292B_2$, absorbs the waste heat from the second chip 224B (e.g., GPU of the first chipset 224, and becomes a partially heated coolant 298B. The partially heated coolant 298B flows to the intermediate fluid channel 294 from the third body section $292B_3$ via the return section 292C. The partially heated coolant $292B_3$ absorbs the waste heat from the third chip 226A (e.g., CPU) of the second chipset 226 and becomes the heated coolant 298C. The heated coolant 298C flows into CDU and transfers waste heat to the facility fluid via a heat exchanger (not shown) and thereby the heated coolant 298C cools to become the coolant 298A (i.e., the heated coolant 298C returns to a cooled state).

FIG. 5 depicts a block diagram of a portion of a datacenter environment 500 having a coolant distribution unit (CDU) 501 and an electronic device 503 having a first circuit assembly 507, a second circuit assembly 509, a plurality of circuit modules 504, and a plurality of cooling modules 506. Each circuit module of the plurality of circuit modules 504 and each cooling module of the plurality of cooling modules 506 are similar to the circuit module 204 and the cooling module 206, respectively, as discussed in the example of FIGS. 2-4. Therefore, for the purpose of brevity of description, each of the plurality of circuit modules 504 and each of the plurality of cooling modules 506 are not discussed in details in the example of FIG. 5, and such non-description of each of the plurality of circuit modules 504 and each of the plurality of cooling modules 506 should not be construed as a limitation of the present disclosure. In some examples, each circuit module of the plurality of circuit modules 504 includes a first chipset 524 and a second chipset 526 and each cooling module of the plurality of cooling modules 506 includes a cooling component 536 and a bypass screw 580. In some examples, each cooling module of the plurality of cooling modules 506 further includes a second cooling component 538 fluidically coupled to the cooling component 536.

Although not shown in the example of FIG. 5, for the purpose of ease of illustration, the datacenter environment 500 may have four cabinets, each of the four cabinets may have two racks, each of the two racks may have four chassis (e.g., four electronic devices), each of the four chassis may have eight trays, each of the eight trays may have two nodes (e.g., two circuit assemblies), and each of the two nodes may have eight modules (e.g., circuit modules). Further, the CDU 501 of the datacenter environment 500 may be configured to supply coolant 578 at the rate of about 1 gallon per minute of coolant 578 to each of the eight trays to four cabinets in the datacenter environment 500.

In the illustrated example of FIG. 5, the datacenter environment 500 includes one cabinet (not labeled), one rack (not labeled), and one electronic device 503 (e.g., chassis). Further, the electronic device 503 in the illustrated example of FIG. 5 has one tray 505, and the tray 505 includes two circuit assemblies, e.g., a first circuit assembly 507 and a second circuit assembly 509. In one or more examples, the electronic device 503 further includes a plurality of circuit modules 504. In some examples, the plurality of circuit modules 504 are referenced as a first set of circuit modules 504A and a second set of circuit modules 506B. In the illustrated embodiment of FIG. 5, the first set of circuit modules 504A has two circuit modules and the second set of circuit modules 504B has four circuit modules.

Each circuit module of the first set of circuit modules 504A includes a first chipset 524A and a second chipset 526A. Similarly, each circuit module of the second set of circuit modules 504B includes a first chipset 524B and a second chipset 526B.

In one or more examples, the electronic device 503 further includes a plurality of cooling modules 506 thermally coupled to the plurality of circuit modules 504. In some examples, the plurality of cooling modules 506 are referenced as a first set of cooling modules 506A and a second set of cooling modules 506B. In the illustrated embodiment of FIG. 5, the first set of cooling modules 506A has two cooling modules and the second set of cooling modules 506B has four cooling modules. Each cooling module of the first set of cooling modules 506A includes a cooling component 536A, a bypass screw 580A, and a second cooling component 538A. Similarly, each cooling module of the second set of cooling modules 506B includes a cooling component 536B, a bypass screw 580B, and a second cooling component 538B. The first set of cooling modules 506A is thermally coupled to the first set of circuit modules 504A and the second set of cooling modules 506B is thermally coupled to the second set of circuit modules 504B.

In one or more examples, the first circuit assembly 507 and the second circuit assembly 509 may be mounted on and coupled to a tray 505 of the chassis of the electronic device 503. The first set of circuit modules 506A may be mounted on and coupled to the first circuit assembly 507. Similarly, the second set of circuit modules 504B may be mounted on and coupled to the second circuit assembly 509. Further, the first set of cooling modules 506A is thermally coupled to the first set of circuit modules 504A and the second set of cooling modules 506B is thermally coupled to the second set of circuit modules 504B. Further, the CDU 501 is fluidically connected to the tray 505 via an inlet manifold 511. For example, the inlet manifold 511 is bifurcated into a first set of parallel inlet manifolds 511A and a second set of parallel inlet manifolds 511B. In the illustrated embodiment of FIG. 5, the first set of parallel inlet manifolds 511A has two parallel inlet manifolds and the second set of parallel inlet manifolds 511B has four parallel inlet manifolds. Each inlet manifold of the first set of parallel inlet manifolds 511A is connected to a coolant inlet 566A of a corresponding cooling module of the first set of cooling modules 506A. Similarly, each inlet manifold of the second set of parallel inlet manifolds 511B is connected to a coolant inlet 566B of a corresponding cooling module of the second set of cooling modules 506B. Further, a coolant outlet 568A of each cooling module of the first set of cooling modules 506A and a coolant outlet 568B of each cooling module of the second set of cooling modules 506B may be connected to an outlet manifold (not shown) of the CDU 501.

During the operation of the datacenter environment 500, each circuit module 504 of the first set of circuit modules 504A in the first circuit assembly 507, and the second set of circuit modules 506B in the second circuit assembly 509 generates waste heat. Such waste heat is undesirable because it may negatively impact the operation of the first circuit assembly 507 and the second circuit assembly 509. For example, the waste heat may cause physical damage to the one or more chips, degrade performance, reliability, or life expectancy of the corresponding circuit module of the first set of circuit modules 504A and the second set of circuit modules 504B, and in some cases the waste heat may even cause failure of the first circuit assembly 507 and/or the second circuit assembly 509. To overcome such issues of waste heat in the first and second sets of circuit modules 504A and 504B, the CDU 501 may supply the coolant 598 to each cooling module of the first set of cooling modules 506A and the second set of cooling modules 506B via an inlet manifold 511 for removing the waste heat from the corresponding circuit module. For example, the first set of parallel flow paths 511A of the CDU 501 may circulate a first portion 597A of the coolant 598 to the first set of cooling modules 506A, and a second set of parallel flow paths 511B may circulate a second portion 599A of the coolant 598 to the second set of cooling modules 506A. The CDU 501 may be configured to circulate an equal portion of coolant 598 (e.g., one gallon of coolant per minute) to each set of cooling modules among the first set of cooling modules 506A and the second set of cooling modules 506B to efficiently remove waste heat from each set of circuit modules among the first set of circuit modules 504A and the second set of circuit modules 506B. The first portion 597A of the coolant 598 may undergo a greater flow restriction because of the lesser number of parallel flow paths in the first set of parallel flow paths 511A and the lesser number of cooling modules in the first set of cooling modules 506A. On the other hand, the second portion 599A of the coolant 598 may undergo a lesser flow restriction because of the greater number of parallel flow paths in the second set of parallel flow paths 511B and the greater number of cooling modules in the second set of cooling modules 506B. Thus, the flow of coolant 598 from the CDU 501 may tend to flow more towards the second set of cooling modules 506B having less flow restrictions compared to the first set of cooling modules 506A. For example, the first set of cooling modules 506A may receive about 0.5 gallon of coolant per minute (instead of 1 gallon per minute) and the second set of cooling modules 506B may receive about 1.5 gallon of coolant per minute (instead of 1 gallon per minute) from the CDU 501. Accordingly, a flow imbalance may occur between the first set of cooling modules 506A and the second set of cooling modules 506B. Therefore, each cooling module of the first set of cooling modules 506A may become ineffective to remove waste heat from each circuit module of the first set of circuit modules 504A. Thus, such waste heat may cause physical damage to the one or more chips of each circuit module of the first set of circuit modules 504A, degrade performance, reliability, or life expectancy of each circuit module of the first set of circuit modules 504A, and in some cases the waste heat may even cause failure of the first circuit assembly 507.

To address such issues related to the flow imbalance of the coolant 598 between the first and second sets of cooling modules 506A and 506B, the bypass screw 580 is configured to regulate (e.g., by at least partially opening or entirely closing the bypass screw) a portion of the first portion 597A or the second portion 599A of the coolant 598 to bypass one or more flow restriction sections (e.g., first and second body sections) in the cooling module of the first or second sets of cooling modules 506A, 506B. For example, the bypass screw 580A of each cooling module of the first set of cooling modules 506A may move outside (e.g., partially outside) a second orifice 584A to uncover a first orifice 582A and allow the portion $597A_1$ of the first portion 597A of the coolant 598 to flow directly from a supply section 591A to the third body section $591B_3$, and bypass the first and second body sections $591B_1$ and $592B_2$. Further, the bypass screw 580B of each cooling module of the second set of cooling modules 506B may move inside (e.g., entirely inside) a second orifice 584B to cover a first orifice 582B and prevent a portion of the second portion 599A of the coolant 598 from flowing directly from the supply section 593A to the third body section 592B₃.

Thus, the bypass screw 580A of each cooling module of the first set of cooling modules 506A creates an additional parallel flow path and allows the portion 597A₁ of the first portion 597A of the coolant 598 to flow to the third body section 591B₃. Hence, the bypass screws 580A of each cooling module of the first set of cooling modules 506A reduces flow restrictions caused due to a lesser number of cooling modules and a lesser number of parallel flow paths in the first set of cooling modules 506A as compared to the second set of cooling modules 506B. Accordingly, the bypass screws 580A and 580B of each cooling module of the first and second sets of cooling modules 506A and 506B may balance the flow of the coolant 598 from the CDU 501 between the first and second sets of cooling modules 506A and 506B.

In some examples, the portion 597A₁ of the coolant 598 and the portion 597A₁ of the first portion 597A of the coolant 598 absorbs the waste heat from the first chipset 524A in the first set of circuit modules 504A and becomes a partially heated coolant 597B. The partially heated coolant 597B is directed to the second cooling component 538A via the return section 591C. The partially heated coolant 597B absorbs the waste heat from the second chipset 526A of the second set of circuit modules 504A and becomes a heated coolant 597C. The heated coolant 597C from each cooling module of the first set of cooling modules 506A is directed to the CDU 501. In some examples, the second portion 599A1 of the coolant 598 absorbs the waste heat from the first chipset 524B in the second set of circuit modules 504B and becomes a partially heated coolant 599B. The partially heated coolant 599B is directed to the second cooling component 538B via the return section 593C. The partially heated coolant 599B absorbs the waste heat from the second chipset 526B of the second set of circuit modules 504B and becomes a heated coolant 599C. The heated coolant 599C from each cooling module of the second set of cooling modules 506B is directed to the CDU 501. The CDU 501 receives the heated coolant 597C and 599C from the first set of cooling modules 506A and the second set of cooling modules 506B, respectively. As discussed herein, the heated coolant 597C and 599C may flow into CDU 501 and transfers waste heat to facility fluid via a heat exchanger (not shown), and thereby the heated coolant 597C and 599C cools to become the coolant 598 (i.e., the heated coolant 597C and 599C returns to a cooled state).

FIG. 6 is a flowchart depicting a method 600 of balancing a flow of coolant between a plurality of cooling modules in a first circuit assembly and a second circuit assembly of an electronic device. It should be noted herein that the method 600 is described in conjunction with FIGS. 2A-1F and FIGS. 3-5, for example. The method 600 starts at block 602 and continues to block 604.

At block 604, the method 600 includes directing a flow of a first portion of a coolant from a coolant distribution unit (CDU) to a plurality of cooling modules thermally coupled to a plurality of circuit modules of a first circuit assembly. In some examples, the plurality of circuit modules includes a first set of circuit modules coupled to the first circuit assembly. In such examples, the plurality of cooling modules includes a first set of cooling modules thermally coupled to the first set of circuit modules. In some examples, the first circuit assembly includes up to four circuit modules and four cooling modules. For example, the first circuit modules may include four circuit modules and the first cooling modules includes four cooling modules. In some examples, the CDU directs the first portion of coolant to each cooling module of the first set of cooling modules via a first set of parallel inlet manifolds of the CDU. The method 600 continues to block 606.

At block 606, the method 600 includes directing a flow of a second portion of the coolant from the CDU to the plurality of cooling modules thermally coupled to the plurality of circuit modules of a second circuit assembly. In some examples, the plurality of circuit modules further includes a second set of circuit modules coupled to the second circuit assembly. In such examples, the plurality of cooling modules includes a second set of cooling modules thermally coupled to the second set of circuit modules. In some examples, the second circuit assembly includes up to eight circuit modules and eight cooling modules. For example, the second circuit modules may include eight circuit modules and the second cooling modules includes eight cooling modules.

In some examples, each cooling module of the plurality of cooling modules includes a cooling component including a fluid channel having a supply section, a body section, and a return section, where the body section is bifurcated into a first body section and a second body section and the first and second body sections are further merged into a third body section, and where the supply section is connected to the first and second body sections and the return section is connected to the third body section. Each cooling module of the plurality of cooling modules further includes a bypass screw connected to the cooling component. The cooling component of each cooling module further comprises: i) a first orifice extending between the third body section and a bifurcation region where the body section is bifurcated into the first and second body sections and ii) a second orifice extending inside the cooling component and intersecting the first orifice. The bypass screw of each cooling module is movably connected to the cooling component via the second orifice. The method 600 continues to block 608.

At block 608, the method 600 includes opening the bypass screw of each of at least one cooling module in the first circuit assembly to allow a sub-portion of the first portion of the coolant to flow directly from the supply section to the third body section and bypass the first and second body sections. In some examples, opening the bypass screw of each cooling module in the first circuit assembly includes moving the bypass screw outside (e.g., partially outside) the second orifice to uncover the first orifice and allow the sub-portion of the first portion of the coolant to flow directly from the supply section to the third body section. The method 600 continues to block 610.

At block 610, the method 600 includes closing the bypass screw of each cooling module in the second circuit assembly to prevent a sub-portion of the second portion of the coolant from flowing directly from the supply section to the third body section to balance the flow of the first and second portions of the coolant between the plurality of cooling modules in the first and second circuit assemblies. In some examples, closing the bypass screw of each cooling module in the second circuit assembly includes moving the bypass screw inside (e.g., entirely inside) the second orifice to cover the first orifice and prevent the sub-portion of the second portion of the coolant from flowing directly from the supply section to the third body section. Thus, the bypass screw in each cooling module in the first and second sets of cooling modules may regulate the flow of the first and second portions of the coolant into the corresponding cooling module of the first and second sets of cooling modules, and thereby balance the flow of the first and second portions of the coolant between the plurality of cooling modules in the first and second circuit assemblies.

In some examples, each cooling module further includes a second cooling component including an intermediate fluid channel, wherein the intermediate fluid channel is fluidically coupled to the return section and a second fluid channel of the cooling component, and wherein the coolant flows from an inlet to an outlet of the cooling module through i) the supply section, the first and second body sections, the third body section, and the return section of the cooling component, ii) the intermediate fluid channel of the second cooling component, and iii) the second fluid channel of the cooling component. The method 600 ends at block 616.

As discussed herein, the bypass screw in each of the plurality of cooling modules regulates a flow of coolant from the CDU, and thereby manages a balance of the flow of coolant between the cooling modules of a first circuit assembly and a second circuit assembly. Since the bypass screw of each cooling module of the first set of cooling modules creates additional parallel flow path and allows each portion of the coolant to flow through one or more flow restrictive sections in the respective cooling module, the bypass screws are configured to reduce flow restrictions which are caused due to a lesser number of cooling modules and a lesser number of parallel flow paths in the first set of cooling modules as compared to the second set of cooling modules. Thus, the bypass screws of the first and second sets of cooling modules are configured to maintain the flow balance between the first and second sets of cooling modules.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A cooling module comprising:
   a cooling component comprising a fluid channel having a supply section, a body section, and a return section, wherein the body section is bifurcated into a first body section and a second body section and the first and second body sections are further merged into a third body section, and wherein the supply section is connected to the first and second body sections and the return section is connected to the third body section; and
   a bypass screw movably connected to the cooling component through a peripheral side portion of the cooling component such that the bypass screw is movable inside and outside the cooling component to regulate a portion of a coolant to flow directly from the supply section to the third body section and bypass the first and second body sections.

2. The cooling module of claim 1, wherein the cooling component further comprises: i) a first orifice extending between the third body section and a bifurcation region where the body section is bifurcated into the first and second body sections, and ii) a second orifice extending inside the cooling component and intersecting the first orifice.

3. The cooling module of claim 2, wherein the bypass screw is movably connected to the cooling component via the second orifice, and wherein the bypass screw moves: i) outside the second orifice to uncover the first orifice and allow the portion of the coolant to flow directly from the supply section to the third body section or ii) inside the second orifice to cover the first orifice and prevent the coolant from flowing directly from the supply section to the third body section.

4. The cooling module of claim 2, wherein the bypass screw further comprises one or more O-ring seals to prevent leakage of the portion of the coolant from the second orifice of the cooling component.

5. The cooling module of claim 1, further comprising a second cooling component comprising an intermediate fluid channel, wherein the intermediate fluid channel is fluidically coupled to the return section and a second fluid channel of the cooling component, and wherein the coolant flows from an inlet to an outlet of the cooling module through i) the supply section, the first and second body sections, the third body section, and the return section of the cooling component, ii) the intermediate fluid channel of the second cooling component, and iii) the second fluid channel of the cooling component.

6. The cooling module of claim 5, wherein the second cooling component is positioned within a recess portion of the cooling component to fluidically connect the second cooling component to the cooling component, and wherein the return section is fluidically connected to the intermediate fluid channel to establish an inlet fluid-flow path from the cooling component to the second cooling component, and the intermediate fluid channel is further fluidically connected to the second fluid channel to establish an outlet fluid-flow path from the second cooling component to the cooling component.

7. The cooling module of claim 5, wherein the body section comprises a plurality of first micro channels that are thermally coupled to a first chipset of a circuit module, and wherein the intermediate fluid channel comprises a plurality of second micro channels that are thermally coupled to a second chipset of the circuit module.

8. An electronic device comprising:
   the cooling module of claim 1;
   a circuit assembly; and
   a plurality of circuit modules coupled to the circuit assembly, wherein the cooling module is thermally coupled to the circuit assembly.

9. An electronic device comprising:
   a first circuit assembly and a second circuit assembly;
   a plurality of circuit modules coupled to the first and second circuit assemblies; and
   a plurality of cooling modules thermally coupled to the plurality of circuit modules, wherein each cooling module of the plurality of cooling modules comprises:
      a cooling component comprising a fluid channel having a supply section, a body section, and a return section, wherein the body section is bifurcated into a first body section and a second body section and the first and second body sections are further merged into a third body section, and wherein the supply section is connected to the first and second body sections and the return section is connected to the third body section; and
      a bypass screw movably connected to the cooling component,
   wherein the bypass screw of each cooling module coupled to the first circuit assembly is opened to allow a sub-portion of a first portion of a coolant to flow directly from the supply section to the third body section and bypass the first and second body sections, and the bypass screw of each cooling module coupled to the second circuit assembly is closed to prevent a sub-portion of a second portion of the coolant from flowing directly from the supply section to the third body section to balance the flow of the first and second portions of the coolant between the plurality of cooling modules in the first and second circuit assemblies.

10. The electronic device of claim 9, wherein the first circuit assembly comprises up to four circuit modules and four cooling modules and wherein the second circuit assembly comprises up to eight circuit modules and eight cooling modules.

11. The electronic device of claim 9, wherein the cooling component of each cooling module further comprises: i) a first orifice extending between the third body section and a bifurcation region where the body section is bifurcated into the first and second body sections, and ii) a second orifice extending inside the cooling component and intersecting the first orifice.

12. The electronic device of claim 11, wherein the bypass screw of each cooling module is movably connected to the cooling component via the second orifice,
wherein the bypass screw of each cooling module coupled to the first circuit assembly moves outside the second orifice to uncover the first orifice and allow the sub-portion of the first portion of the coolant to flow directly from the supply section to the third body section, and
wherein the bypass screw of each cooling module coupled to the second circuit assembly moves inside the second orifice to cover the first orifice and prevent the sub-portion of the second portion of the coolant from flowing directly from the supply section to the third body section.

13. The electronic device of claim 11, wherein the bypass screw of each cooling module further comprises one or more O-ring seals to prevent leakage of the first portion of the coolant or the second portion of the coolant from the second orifice of the cooling component.

14. The electronic device of claim 9, wherein each cooling module further comprises a second cooling component comprising an intermediate fluid channel, wherein the intermediate fluid channel is fluidically coupled to the return section and a second fluid channel of the cooling component, and wherein the coolant flows from an inlet to an outlet of the cooling module through i) the supply section, the first and second body sections, the third body section, and the return section of the cooling component, ii) the intermediate fluid channel of the second cooling component, and iii) the second fluid channel of the cooling component.

15. The electronic device of claim 14, wherein the second cooling component is positioned within a recess portion of the cooling component to fluidically connect the second cooling component to the cooling component, and wherein the return section is fluidically connected to the intermediate fluid channel to establish an inlet fluid-flow path from the cooling component to the second cooling component, and the intermediate fluid channel is further fluidically connected to the second fluid channel to establish an outlet fluid-flow path from the second cooling component to the cooling component.

16. The electronic device of claim 14, wherein the body section of the cooling component comprises a plurality of first micro channels that are thermally coupled to a first chipset of a corresponding circuit module, and wherein the intermediate fluid channel of the second cooling component comprises a plurality of second micro channels that are thermally coupled to a second chipset of the corresponding circuit module.

17. A method comprising:
directing a flow of a first portion of a coolant from a coolant distribution unit (CDU) to a plurality of cooling modules thermally coupled to a plurality of circuit modules of a first circuit assembly;
directing a flow of a second portion of the coolant from the CDU to the plurality of cooling modules thermally coupled to the plurality of circuit modules of a second circuit assembly, wherein each cooling module of the plurality of cooling modules comprises:
a cooling component comprising a fluid channel having a supply section, a body section, and a return section, wherein the body section is bifurcated into a first body section and a second body section and the first and second body sections are further merged into a third body section, and wherein the supply section is connected to the first and second body sections and the return section is connected to the third body section; and
a bypass screw connected to the cooling component;
opening the bypass screw of each of at least one cooling module in the first circuit assembly to allow a sub-portion of the first portion of the coolant to flow directly from the supply section to the third body section and bypass the first and second body sections; and
closing the bypass screw of each cooling module in the second circuit assembly to prevent a sub-portion of the second portion of the coolant from flowing directly from the supply section to the third body section to balance the flow of the first and second portions of the coolant between the plurality of cooling modules in the first and second circuit assemblies.

18. The method of claim 17, wherein the cooling component of each cooling module further comprises: i) a first orifice extending between the third body section and a bifurcation region where the body section is bifurcated into the first and second body sections and ii) a second orifice extending inside the cooling component and intersecting the first orifice, and wherein the bypass screw of each cooling module is movably connected to the cooling component via the second orifice.

19. The method of claim 18, wherein the bypass screw of each cooling module in the first circuit assembly moves outside the second orifice to uncover the first orifice and allow the sub-portion of the first portion of the coolant to flow directly from the supply section to the third body section, and the bypass screw of each cooling module in the second circuit assembly moves inside the second orifice to cover the first orifice and prevent the sub-portion of the second portion of the coolant from flowing directly from the supply section to the third body section.

20. The method of claim 17, wherein each cooling module further comprises a second cooling component comprising an intermediate fluid channel, wherein the intermediate fluid channel is fluidically coupled to the return section and a second fluid channel of the cooling component, and wherein the coolant flows from an inlet to an outlet of the cooling module through i) the supply section, the first and second body sections, the third body section, and the return section of the cooling component, ii) the intermediate fluid channel of the second cooling component, and iii) the second fluid channel of the cooling component.

* * * * *